(12) United States Patent
Lo

(10) Patent No.: US 7,378,605 B2
(45) Date of Patent: May 27, 2008

(54) INPUT COMPONENT

(75) Inventor: Kuo-Jung Lo, Tucheng (TW)

(73) Assignees: Giga-Byte Communications Inc., Sindian (TW); Giga-Byte Technology Co., Ltd., Sindian (TW)

( * ) Notice: Subject to any disclaimer, the term of this patent is extended or adjusted under 35 U.S.C. 154(b) by 531 days.

(21) Appl. No.: 11/184,149

(22) Filed: Jul. 19, 2005

(65) Prior Publication Data

US 2007/0019458 A1    Jan. 25, 2007

(51) Int. Cl.
*H01H 9/00* (2006.01)

(52) U.S. Cl. .......... 200/5 R; 200/1 B; 200/600

(58) Field of Classification Search ......... 200/1 B, 200/5 R, 5 A, 18, 600, 341; 341/20–22, 341/26, 33, 34; 345/156, 157, 160, 168, 345/169, 172
See application file for complete search history.

(56) References Cited

U.S. PATENT DOCUMENTS

| | | | |
|---|---|---|---|
| 5,945,646 A * | 8/1999 | Miller et al. .......... 200/5 R |
| 6,225,578 B1 * | 5/2001 | Kobayashi et al. ...... 200/5 R |
| 6,410,866 B1 * | 6/2002 | Klein et al. ........... 200/5 R |
| 6,717,571 B2 * | 4/2004 | Chen ................... 345/157 |
| 6,800,819 B2 * | 10/2004 | Sato et al. ............ 200/5 R |
| 6,835,902 B2 * | 12/2004 | Hiraoka ............... 200/5 A |
| 6,867,380 B2 * | 3/2005 | Miki et al. ............ 200/5 R |
| 7,019,225 B2 * | 3/2006 | Matsumoto et al. ..... 200/5 R |
| 7,091,886 B2 * | 8/2006 | DePue et al. ........... 341/33 |
| 7,145,549 B1 * | 12/2006 | Sun ................... 345/157 |
| 7,321,101 B2 * | 1/2008 | Hirobe et al. .......... 200/5 R |

* cited by examiner

*Primary Examiner*—Michael A Friedhofer
(74) *Attorney, Agent, or Firm*—Volpe and Koenig PC

(57) ABSTRACT

In the present invention, an input component is provided. The input component includes a first area performing a first function while pressed with an external force, and a second area disposed around the first area and performing a second function while the first and the second areas simultaneously pressed with the external force.

18 Claims, 3 Drawing Sheets

INPUT COMPONENT

FIELD OF THE INVENTION

The present invention relates to an input component, and more particularly to an input component providing two or even more operational function modes.

BACKGROUND OF THE INVENTION

In the current cellphone market, more and more functions are introduced into different types of cellphones, such as the personal digital assistant (PDA), the smart phone, the clam shell phone, the bar type phone, the flip type phone and so on. No matter how the form of cellphones varies, the basic amount of input component, i.e. the keys, is always the same. As the functions of the cellphone become more and more complicated, it would be a serious problem if the amount of keys is insufficient to meet these functions. Because the amount of keys is unchangeable, the operation of the keys for different functions would be complex and troublesome.

In addition, the size of cellphones tends to be miniaturized in the future. However, with so many functions in one cellphone, it has become an important issue for cellphone manufacturers to provide the user with a more convenient operation, by means of more convenient hot keys or more keys to meet so many functions. However, it is certain that there will be more and more functions introduced into the cellphone, and it is difficult for the cellphone to be equipped with so many keys thereon due to its limited space.

From the above description, it is known that how to develop an input component with more operational functions has become a major problem waited to be solved. In order to overcome the drawbacks in the prior art, an improved input component is provided. The particular design in the present invention not only solves the problems described above, but also is easy to be implemented. Thus, the invention has the utility for the industry.

SUMMARY OF THE INVENTION

In accordance with one aspect of the present invention, an input component is provided. The input component provides two or even more operational function modes for the user.

Preferably, the input component includes a first area performing a first function while pressed with an external force, and a second area disposed around the first area and performing a second function while the first and the second areas simultaneously pressed with the external force.

Preferably, the first area has a radius greater than a substantial width of the second area.

Preferably, the input component is a mechanical key.

Preferably, there is a height difference between the first area and the second area.

Preferably, the input component is a capacitance key.

Preferably, the first area has a first range set by a software.

Preferably, the second area has a second range set by a software.

Preferably, the first function is performed after the external force is removed from the first area.

Preferably, the first function is performed after the first area has been pressed with the external force for a predetermined time period.

In accordance with a further aspect of the present invention, an input component is provided. The input component includes a first area performing a first function while pressed with an external force, and a second area disposed around the first area and having a plurality of sub-areas, wherein a corresponding function is performed while the first area and one of the sub-areas are simultaneously pressed with the external force.

Preferably, the first area has a radius greater than a substantial width of the second area.

Preferably, the input component is a mechanical key.

Preferably, there is a height difference between the first area and the second area.

Preferably, the input component is a capacitance key.

Preferably, the first area has a first range set by a software.

Preferably, the second area has a second range set by a software.

Preferably, the first function is performed after the external force is removed from the first area.

Preferably, the first function is performed after the first area has been pressed with the external force for a predetermined time period.

The above aspects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

For solving the issue of the insufficient amount of keys on the conventional cellphone, an improved key is provided in the present invention. The provided key is divided into a first area and a second area, wherein the second area is provided to perform additional functions so as to be regarded as additional available keys on the cellphone.

Figure 1A:
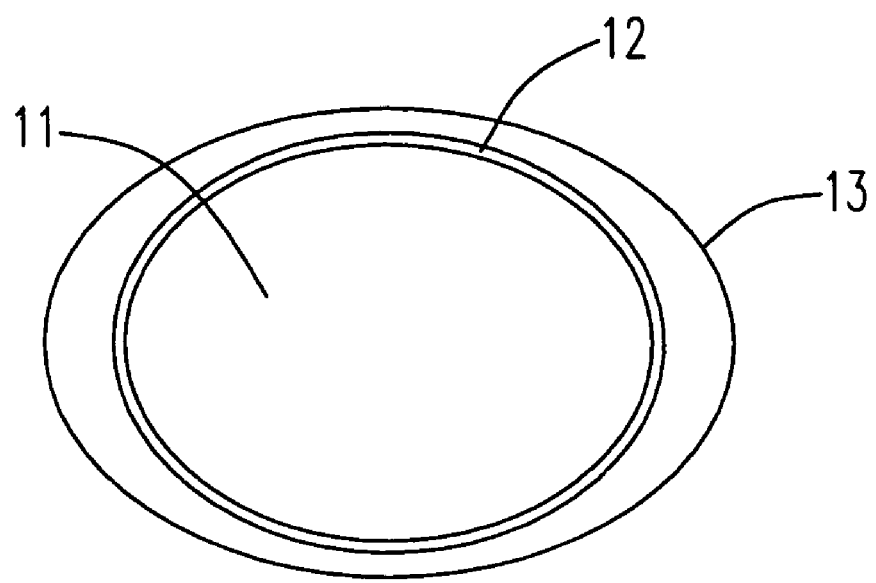
FIG. 1(a) is a top view of the input component according to a first preferred embodiment of the present invention.
Figure 1B:
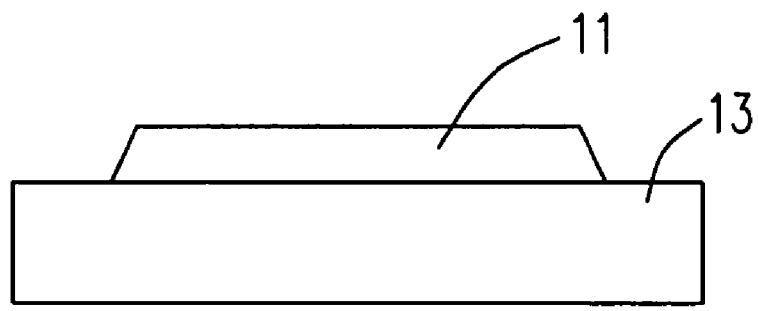
FIG. 1(b) is a side view of the input component of FIG. 1(a)

Please refer to FIG. 1(a), which shows a top view of the input component according to a preferred embodiment of the present invention. The input component includes a first area 11 and a second area 13, wherein the second area 13 is disposed around the first area 11. The input component shown in FIG. 1(a) is preferably a mechanical key, and there are a gap 12 and a height difference between the first area 11 and the second area 13, as shown in FIG. 1(b). When the user presses the first area 11, a first function would be performed. For example, the function of a number key would be performed if the first area 11 of the input component is regarded as a number key. When the user simultaneously presses the first area 11 and the second area 13, a second function, such as a hot key function or a redialing function, would be performed. Generally, the first area 11 has a radius greater than the substantial width, which is defined as the width difference between the outer radius and the inner radius, of the second area 13 in all directions, so that the user could operate the key easily.

Besides, for avoiding the mal-execution, the execution of the first function is further designed as the following two modes:

1. When the user presses the first area 11, the first function would not be performed until he removes his finger from the first area 11. This could avoid the situation that the first function is mal-executed while the user intends to subsequently press the second area 13 to perform the second function.

2. When the user presses the first area 11, the first function would be performed if the pressing lasts for a predetermined time period, such as 0.5 second. That is, the first function would be performed if the user does not subsequently press the second area 13 within the predetermined time period. In other words, the second function would be performed if the user subsequently presses the second area 13 within the predetermined time period so that the mal-execution of the system could be avoided.

Figure 1C:
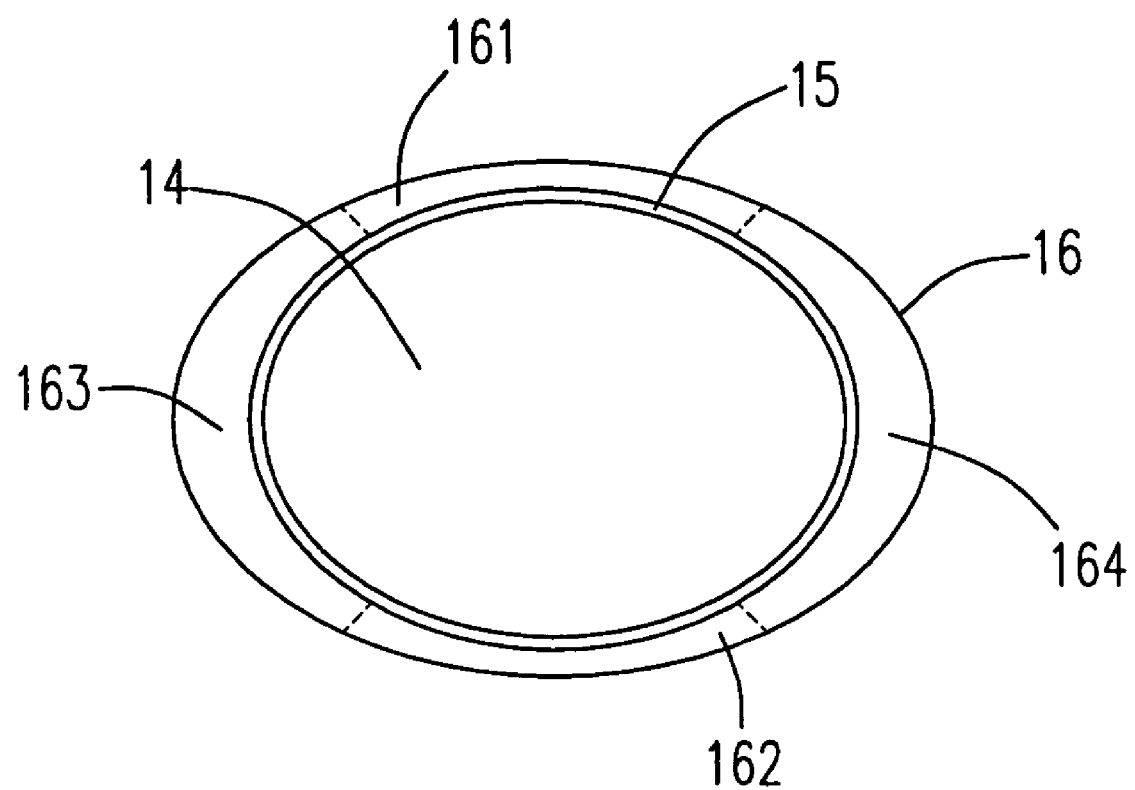
FIG. 1(c) is a top view of the input component according to a second preferred embodiment of the present invention.

In the embodiment of FIG. 1(*a*), the second function would be performed if the user simultaneously presses the first area 11 and any part of the second area 13. Certainly, the second area 13 is able to be divided into a plurality of sub-areas for provision of more operational functions. That is to say, the second area is not limited to one portion only, and is able to be further divided into two or more portions according to actual needs, which is described as follows. Please refer to FIG. 1(*c*), which shows a top view of the input component according to a second preferred embodiment of the present invention. The input component includes a first area 14, a gap 15 and a second area 16, wherein the second area 16 is disposed around the first area 14. The input component of FIG. 1(*c*) differs from that of FIG. 1(*a*) in that the second area 16 thereof is divided into four sub-areas, including an upper area 161, a lower area 162, a left area 163 and a right area 164. A first function would be performed when the user presses the first area 14. However, a corresponding function would be performed while the user simultaneously presses the first area 14 and one of the upper area 161, the lower area 162, the left area 163 and the right area 164. Through the above design, more input components regarded as effective keys could be created. Besides, for avoiding the mal-execution, the execution of the first function in this embodiment could also be designed as the above-mentioned two modes.

Figure 2A:
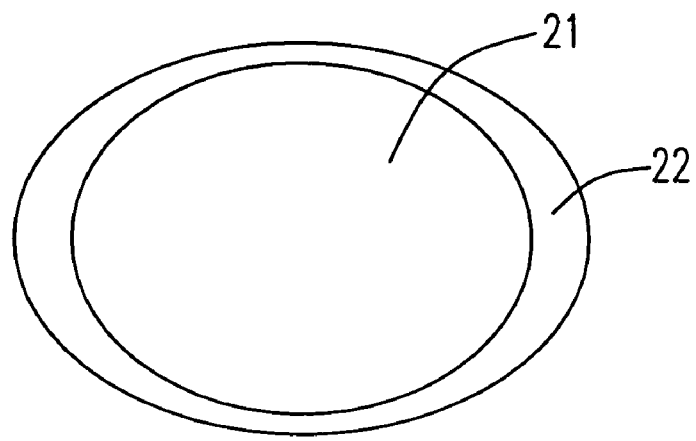
FIG. 2(a) is a top view of the input component according to a third embodiment of the present invention.
Figure 2B:
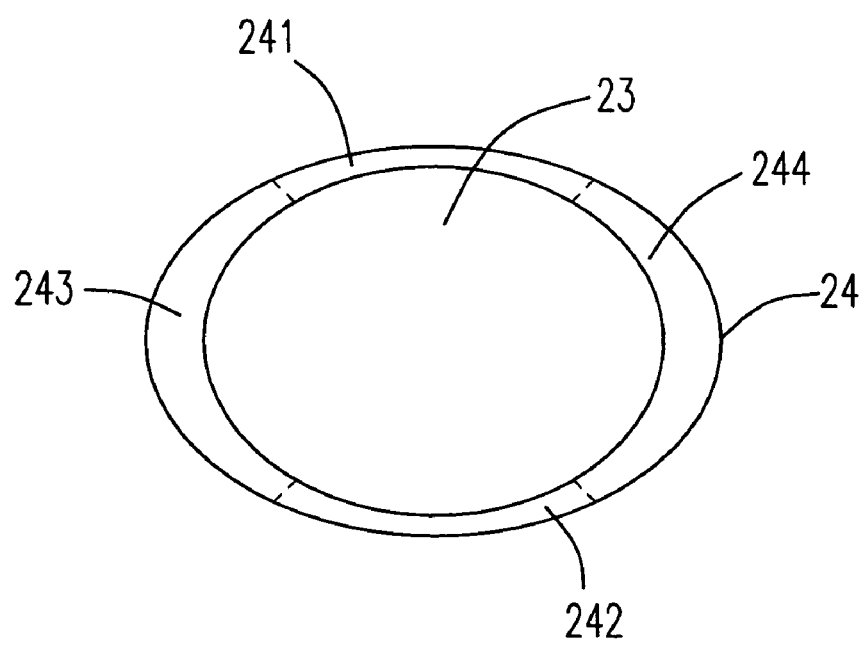
FIG. 2(b) is a top view of the input component according to a fourth embodiment of the present invention.

In addition to the mechanical key, the input component of the present invention could also be the capacitance key. Please refer to FIG. 2(*a*), which shows a top view of the input component according to a third embodiment of the present invention. In this case, the input component is a capacitance key and includes a first area 21 and a second area 22. Since the input component of this embodiment is the capacitance key, there is no gap or height difference between the first area 21 and the second area 22. Moreover, the first area 21 and the second area 22 are configured on a common plane, and the areas of the first area 21 and the second area 22 are respectively set by the software. A first function would be performed when the user presses the first area 21, and a second function would be performed while the user simultaneously presses the first area 21 and the second area 22. Generally, the first area 21 has a radius greater than the substantial width of the second area 22 so that the user could operate the key easily. Besides, for avoiding mal-execution, the execution of the first function in this embodiment is also designed as the above-mentioned two modes. In the embodiment of FIG. 2(*a*), the second function would be performed while the user simultaneously presses the first area 21 and any part of the second area 22. Certainly, the second area 22 is able to be further divided into a plurality of sub-areas for provision of more operational functions.

Please refer to FIG. 2(*b*), which shows a top view of the input component according to a fourth embodiment of the present invention. In this case, the input component is also a capacitance key and includes a first area 23 and a second area 24, wherein the second area 24 is also disposed around the first area 23. The input component of FIG. 2(*b*) differs from that of FIG. 2(*a*) in that the second area 24 thereof is further divided into four sub-areas, including an upper area 241, a lower area 242, a left area 243 and a right area 244. A first function would be performed when the user presses the first area 23, and a corresponding function would be performed while the user simultaneously presses the first area 23 and one of the upper area 241, the lower area 242, the left area 243 and the right area 244. Through the above design, more input components regarded as effective keys could be created. Certainly, the second area 24 is not limited to have four sub-areas, and is able to be divided into four or more sub-areas according to actual needs. Furthermore, for avoiding the mal-execution, the execution of the first function in this embodiment is also designed as the above-mentioned two modes.

In conclusion, the input component of the present invention provides two or even more operational function modes for the user. Accordingly, the present invention can effectively solve the problems and drawbacks in the prior art, and thus it fits the demand of the industry and is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. An input component, comprising:
   a first area performing a first function while pressed with an external force; and
   a second area disposed around said first area and performing a second function while said first and said second areas simultaneously are pressed with said external force.

2. The input component as claimed in claim 1, wherein said first area has a radius greater than a substantial width of said second area.

3. The input component as claimed in claim 1, wherein the input component is a mechanical key.

4. The input component as claimed in claim 3, wherein there is a height difference between said first area and said second area.

5. The input component as claimed in claim 1, wherein the input component is a capacitance key.

6. The input component as claimed in claim 5, wherein said first area has a first range set by a software.

7. The input component as claimed in claim 5, wherein said second area has a second range set by a software.

8. The input component as claimed in claim 1, wherein said first function is performed after said external force is removed from said first area.

9. The input component as claimed in claim 1, wherein said first function is performed after said first area has been pressed with said external force for a predetermined time period.

10. An input component, comprising:
   a first area performing a first function while pressed with an external force; and
   a second area disposed around said first area and having a plurality of sub-areas, wherein a corresponding function is performed while said first area and one of said sub-areas are simultaneously pressed with said external force.

11. The input component as claimed in claim 10, wherein said first area has a radius greater than a substantial width of said second area.

12. The input component as claimed in claim 10, wherein the input component is a mechanical key.

13. The input component as claimed in claim 12, wherein there is a height difference between said first area and said second area.

14. The input component as claimed in claim 10, wherein the input component is a capacitance key.

15. The input component as claimed in claim 14, wherein said first area has a first range set by a software.

16. The input component as claimed in claim 14, wherein said second area has a second range set by a software.

17. The input component as claimed in claim 10, wherein said first function is performed after said external force is removed from said first area.

18. The input component as claimed in claim 10, wherein said first function is performed after said first area has been pressed with said external force for a predetermined time period.

* * * * *